US012807902B2

(12) United States Patent
Kimura

(10) Patent No.: US 12,807,902 B2
(45) Date of Patent: Nov. 24, 2026

(54) PROCESSING SOLUTION FOR SEMICONDUCTOR DEVICE, METHOD FOR PROCESSING SUBSTRATE, AND METHOD FOR MANUFACTURING SEMICONDUCTOR DEVICE

(71) Applicant: TOKYO OHKA KOGYO CO., LTD., Kawasaki (JP)

(72) Inventor: Kenta Kimura, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 328 days.

(21) Appl. No.: 18/680,569

(22) Filed: May 31, 2024

(65) Prior Publication Data

US 2024/0417648 A1 Dec. 19, 2024

(30) Foreign Application Priority Data

Jun. 15, 2023 (JP) ................................ 2023-098535

(51) Int. Cl.

| | |
|---|---|
| ***C11D 3/20*** | (2006.01) |
| ***C09K 13/06*** | (2006.01) |
| ***C09K 13/08*** | (2006.01) |
| ***C09K 15/10*** | (2006.01) |
| ***C11D 3/04*** | (2006.01) |
| ***C11D 3/34*** | (2006.01) |
| ***C11D 3/43*** | (2006.01) |
| ***C11D 7/30*** | (2006.01) |
| ***H10P 50/00*** | (2026.01) |
| ***H10P 50/24*** | (2026.01) |
| ***H10P 70/00*** | (2026.01) |
| ***H10P 76/20*** | (2026.01) |

(52) U.S. Cl.

CPC ............ *C11D 3/2068* (2013.01); *C11D 3/042* (2013.01); *C11D 3/43* (2013.01); *H10P 50/242* (2026.01); *H10P 50/692* (2026.01); *H10P 70/23* (2026.01); *H10P 76/20* (2026.01); *C11D 2111/22* (2024.01)

(58) Field of Classification Search

CPC ......... C11D 3/20; C11D 3/2068; C11D 3/245; C11D 3/34; C11D 3/3445; C11D 3/43; C11D 7/30; C11D 7/5018; C09K 13/06; C09K 13/08; C09K 15/10

See application file for complete search history.

(56) References Cited

U.S. PATENT DOCUMENTS

| | | | | |
|---|---|---|---|---|
| 2006/0138399 A1 | 6/2006 | Itano et al. | | |
| 2008/0006305 A1 * | 1/2008 | Bernhard | .............. C11D 3/044 | 510/176 |

FOREIGN PATENT DOCUMENTS

| | | | |
|---|---|---|---|
| JP | S 61-172147 | A | 8/1986 |
| JP | 3255551 | B2 | 2/2002 |
| JP | 2003-68699 | A | 3/2003 |
| JP | 2006-98421 | A | 4/2006 |
| WO | WO 2004/019134 | A1 | 3/2004 |

* cited by examiner

*Primary Examiner* — Brian P Mruk

(74) *Attorney, Agent, or Firm* — Knobbe, Martens, Olson & Bear, LLP

(57) ABSTRACT

A processing solution for a semiconductor device including a fluorine-containing compound, water, a cyclic ether compound, and a water-soluble organic solvent that is not the cyclic ether compound; a method for processing a substrate; and a method for manufacturing a semiconductor device.

10 Claims, No Drawings

PROCESSING SOLUTION FOR SEMICONDUCTOR DEVICE, METHOD FOR PROCESSING SUBSTRATE, AND METHOD FOR MANUFACTURING SEMICONDUCTOR DEVICE

TECHNICAL FIELD

The present invention relates to a processing solution for a semiconductor device, a method for processing a substrate, and a method for manufacturing a semiconductor device.

BACKGROUND ART

Semiconductor elements and liquid crystal panel elements such as ICs, LSIs, etc. are manufactured, for example, by: uniformly applying a resist on a metal film, insulating film such as a $SiO_2$ film, etc. that have been CVD-deposited on a substrate; selectively performing exposure and development processings on the substrate to form a resist pattern; with the pattern as a mask, selectively etching the substrate on which the metal film, insulating film such as a $SiO_2$ film, etc. have been CVD-deposited to form fine circuits; and removing unnecessary regions of the resist layer.

As the CVD-deposited metal film, various kinds of metal films are used. These metal films are formed in a single layer or multiple layers on the substrate.

On the other hand, with the recent increase in density of integrated circuits, dry etching, which allows fine etching with higher density, has become mainstream. Due to the etching processing, residues such as an altered film, etc. or residues derived from another component may remain on sides, bottoms, etc. of the pattern. In addition, metal depositions are generated when the metal film is scraped during the etching. If the residues and depositions are not sufficiently removed, they cause problems such as a decrease in the production yield of semiconductors. Therefore, a processing solution (also called a cleaning solution, stripping solution, etc.) is used to remove such residues or depositions.

For example, Patent Document 1 discloses a resist stripping solution composition that contains hydrofluoric acid, a water-soluble organic solvent, and at least one anticorrosive agent selected from the group consisting of an aromatic hydroxy compound, acetylene alcohol, a carboxyl group-containing organic compound and an anhydride thereof, and a triazole compound.

PATENT DOCUMENT

Japanese Patent No. 3255551

SUMMARY OF THE INVENTION

However, the above-described residues, depositions, etc. have different compositions depending on the kind of etching gas, the kind of metal formed on a substrate, the kind of insulating film, the kind of resist used, and the like. Due to various improvements in semiconductors in recent years, processing conditions in various processes have become harsher, and the kinds of metal, insulating film, and resist used have become more diverse, causing difficulty in removing residues. In view of these circumstances, there is still room for further improvement in conventional processing solutions.

The present invention has been made in view of the above circumstances, and it is an object of the present invention to provide a processing solution for a semiconductor device, a method for processing a substrate, and a method for manufacturing a semiconductor device, which have excellent residue removal properties for a residue generated after etching and excellent anti-corrosion effect on a substrate on which a metal layer is formed.

As a result of intensive studies to achieve the above object, the present inventor has found that the above problems can be solved by a processing solution for a semiconductor device, containing a fluorine-containing compound, water, a cyclic ether compound, and a water-soluble organic solvent that is not the cyclic ether compound.

That is, the present invention is as follows:

(1) A processing solution for a semiconductor device, containing: a fluorine-containing compound, water, a cyclic ether compound, and a water-soluble organic solvent that is not the cyclic ether compound.

(2) The processing solution for the semiconductor device according to (1), in which the cyclic ether compound has a ring formed by 2 to 4 carbon atoms and 1 to 2 oxygen atoms.

(3) The processing solution for the semiconductor device according to (1) or (2), in which the mass ratio of the water-soluble organic solvent to the cyclic ether compound is from 100,000 to 15,000,000.

(4) The processing solution for the semiconductor device according to (1) or (2), in which the content of the cyclic ether compound in the processing solution is from 0.000001% by mass to 10% by mass.

(5) The processing solution for the semiconductor device according to (1) or (2), in which the semiconductor device includes a substrate having an Al-containing metal layer, and the processing solution is used for processing the metal layer.

(6) The processing solution for the semiconductor device according to (1) or (2), in which the semiconductor device includes a substrate having a Cu-containing metal layer, and the processing solution is used for processing the metal layer.

(7) The processing solution for the semiconductor device according to (1) or (2), in which the processing solution is used for removing a residue generated on a substrate having a metal layer after an etching processing, and the substrate is used for manufacturing the semiconductor device.

(8) A method for processing a substrate, including: forming a resist pattern on the substrate having an Al and/or Cu-containing metal layer; dry etching the substrate with the resist pattern as a mask; and removing a residue from the substrate using a processing solution for a semiconductor device that contains a fluorine-containing compound, a water-soluble organic solvent, water, and a cyclic ether compound.

(9) A method for manufacturing a semiconductor device, including: forming a resist pattern on the substrate having an Al and/or Cu-containing metal layer; dry etching the substrate with the resist pattern as a mask; and removing a residue from the substrate using a processing solution for a semiconductor device that contains a fluorine-containing compound, a water-soluble organic solvent, water, and a cyclic ether compound.

The present invention can provide a processing solution for a semiconductor device, a method for processing a substrate, and a method for manufacturing a semiconductor device, which have excellent residue removal properties for a residue generated after etching and excellent anti-corrosion effect on a substrate on which a metal layer is formed.

DETAILED DESCRIPTION OF THE INVENTION

Hereinafter, an embodiment for carrying out the present invention (hereinafter simply referred to as "the present embodiment") will be described in detail. The present embodiment below is an example for explaining the present invention, and it is not intended to limit the present invention to the following description. The present invention may be implemented with any appropriate modification within the scope of its gist.

Processing Solution for a Semiconductor Device

A processing solution for a semiconductor device according to the present embodiment is a processing solution for a semiconductor device that contains a fluorine-containing compound, water, a cyclic ether compound, and a water-soluble organic solvent that is not the cyclic ether compound.

Component (a)

A fluorine-containing compound (a) is a compound containing a fluorine atom. The fluorine-containing compound is preferably a compound that does not contain a metal ion. Specific examples of the fluorine-containing compound may include ammonium fluoride (AF), hydrogen fluoride (HF), ammonium borofluoride, methylamine hydrogen fluoride, ethylamine hydrogen fluoride, propylamine hydrogen fluoride, tetramethylammonium fluoride, tetraethylammonium fluoride, ethanolamine hydrogen fluoride, methylethanolamine hydrogen fluoride, dimethylethanolamine hydrogen fluoride, hydroxylamine hydrogen fluoride, dimethylhydroxylamine hydrogen fluoride, triethylene diamine hydrogen fluoride, and the like. Among them, ammonium fluoride (AF) and hydrogen fluoride (HF) are preferable, and ammonium fluoride is more preferable. These may be used alone or in combination of two or more.

When two or more kinds are used in combination as the component (a), the combination preferably includes two kinds: ammonium fluoride and hydrogen fluoride; and more preferably the combination includes only the two kinds of ammonium fluoride and hydrogen fluoride as the component (a). When ammonium fluoride and hydrogen fluoride are used in combination, the mass ratio of hydrogen fluoride to ammonium fluoride (hydrogen fluoride/ammonium fluoride) is preferably 0.01 (for example, ammonium fluoride:hydrogen fluoride=1:0.01) or more and 0.1 (for example, ammonium fluoride:hydrogen fluoride=1:0.1) or less. The lower limit of the mass ratio is preferably 0.03 (for example, ammonium fluoride:hydrogen fluoride=1:0.03) or more. The upper limit of the mass ratio is preferably 0.07 (for example, ammonium fluoride:hydrogen fluoride=1:0.07) or less.

The content of the component (a) is preferably from 0.01 to 10% by mass. The lower limit of the content of the component (a) is more preferably 0.5% by mass or more, and even more preferably 0.8% by mass or more. The upper limit of the content of the component (a) is more preferably 5% by mass or less, even more preferably 3% by mass or less, and still even more preferably 2% by mass or less.

Component (b)

As water (b), deionized water (DIW), ultrapure water (UPW), pure water, high purity ionized water, and the like can be used from the viewpoint of suitability for manufacturing a semiconductor device. Among them, deionized water is preferable.

The content of the component (b) is preferably from 10 to 50% by mass. The lower limit of the content of the component (b) is more preferably 20% by mass or more, and even more preferably 25% by mass or more. The upper limit of the content of the component (b) is more preferably 40% by mass or less, and even more preferably 35% by mass or less.

Component (c)

A cyclic ether compound (c) preferably contains one ring containing an oxygen atom in the molecule. The number of carbon atom forming the ring in the cyclic ether compound (c) is preferably from 2 to 4. The number of carbon atom forming a ring as used herein is the number of carbon atom present in a ring. Further, the number of oxygen atom forming the ring of the cyclic ether compound is preferably from 1 to 2.

The molecular weight of the cyclic ether compound (c) is not particularly limited, but is preferably 200 or less, more preferably 150 or less, even more preferably 105 or less, still even more preferably 90 or less, and further more preferably 50 or less. The lower limit of the molecular weight of the component (c) is preferably 40 or more.

Specific examples of the component (c) may include ethylene oxide (oxirane; molecular weight: 44.5), 1,4-dioxane (molecular weight: 88.1), tetrahydrofuran (THF, molecular weight: 72.1), 4-methyltetrahydropyran (MTHP, molecular weight 100), and the like. Among them, ethylene oxide and 1,4-dioxane are preferable, and ethylene oxide is more preferable. These may be used alone or in combination of two or more. Note that the component (c) preferably contains only ethylene oxide and/or 1,4-dioxane. When ethylene oxide and 1,4-dioxane are used in combination, their mass ratio (ethylene oxide:1,4-dioxane) is, for example, from 10:90 to 90:10, preferably from 15:85 to 85:15, more preferably from 15:85 to 60:40, and even more preferably from 15:85 to 55:45.

The content of the component (c) is preferably from 0.000001% by mass to 10% by mass. The lower limit of the content of the component (c) is more preferably 0.000005% by mass or more, even more preferably 0.000008% by mass or more, and still even more preferably 0.00001% by mass or more. The upper limit of the content of the component (c) is more preferably 5% by mass or less, even more preferably 1% by mass or less, still even more preferably 0.01% by mass or less, further more preferably 0.001% by mass or less, and still further more preferably 0.0003% by mass or less.

Component (d)

A water-soluble organic solvent (d) may be any water-soluble organic solvent that is miscible with the component (a), component (b), and component (c). The water-soluble organic solvent may be appropriately selected in consideration of the kinds and contents of the components (a), (b), and (c) used. The component (d) is preferably a solvent other than the compound(s) that are used as the component (c). In addition, the component (d) is preferably a water-soluble organic solvent that is not the cyclic ether compound.

Specific examples of the component (d) may include sulfoxides such as dimethyl sulfoxide (DMSO), etc.; sulfones such as dimethylsulfone, diethylsulfone, bis(2-hydroxyethyl) sulfone, tetramethylenesulfone, etc.; amides such as N,N-dimethylformamide (DMF), N-methylformamide, N, N-dimethylacetamide, N-methylacetamide, N,N-diethylacetamide, etc.; lactams such as N-methyl-2-pyrrolidone (NMP), N-ethyl-2-pyrrolidone, N-propyl-2-pyrrolidone, N-hydroxymethyl-2-pyrrolidone, N-hydroxyethyl-2-pyrrolidone, etc.; imidazolidinones such as 1,3-dimethyl-2-imidazolidinone, 1,3-diethyl-2-imidazolidinone, 1,3-diisopropyl-2-imidazolidinone, etc.; lactones such as γ-butyrolactone, δ-valerolactone, etc.; polyhydric alcohols such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, etc.; and a derivative thereof. Among them, from the viewpoint of further improving the effects of the present embodiment, sulfoxides, amides, and lactams are preferable; dimethyl sulfoxide, N,N-dimethylformamide, N-methyl-2-pyrrolidone, etc. are more preferable; and dimethyl sulfoxide is even more preferable.

The combination of the component (c) and the component (d) preferably contains only: as the component (c) at least one selected from the group consisting of ethylene oxide and 1,4-dioxane; and as the component (d) at least one selected from the group consisting of dimethyl sulfoxide, N, N-dimethylformamide, and N-methyl-2-pyrrolidone. The combination thereof more preferably contains only: as the component (c) ethylene oxide and/or 1,4-dioxane; and as the component (d) at least one selected from the group consisting of dimethyl sulfoxide, N, N-dimethylformamide, and N-methyl-2-pyrrolidone.

The content of the component (d) is preferably from 50 to 80% by mass. The lower limit of the content of the component (d) is more preferably 60% by mass or more, and even more preferably 65% by mass or more. The upper limit of the content of the component (d) is more preferably 75% by mass or less, and even more preferably 70% by mass or less.

The mass ratio of the water-soluble organic solvent (d) to the cyclic ether compound (c), (d)/(c) is, for example, from 100,000 to 15,000,000, and preferably from 200,000 to 10,000,000. The lower limit of the mass ratio is more preferably 600,000 or more, and even more preferably 650,000 or more. The upper limit of the mass ratio is more preferably 9,000,000 or less, even more preferably 8,000,000 or less, and still even more preferably 7,000,000 or less.

By formulating the components (c) and (d) in the above ratio, both residue removal properties for a residue generated after etching and suppression of corrosion on metal can be achieved. Surprisingly, when only the component (d) is contained as a solvent, an effect obtained by setting the ratio within the above range is particularly excellent (However, the mechanism according to the present embodiment is not limited thereto.).

Other Components

The processing solution for the semiconductor device according to the present embodiment may further contain a component other than the components (a) to (d) as long as an effect of the present embodiment can be obtained. Examples thereof may include an anticorrosive agent, a surfactant, and the like. The anticorrosive agent is, for example, at least one selected from the group consisting of an aromatic hydroxy compound, acetylene alcohol, a carboxyl group-containing organic compound and an anhydride thereof, a triazole compound, and sugars. Examples of the surfactant may include a nonionic surfactant, an anionic surfactant, a cationic surfactant, and an amphoteric surfactant. From the viewpoint of anti-corrosion properties, a nonionic surfactant is preferable.

The processing solution for the semiconductor device according to the present embodiment preferably does not contain a water-insoluble organic solvent as its solvent. Examples of the water-insoluble organic solvent may include a halogen-substituted or unsubstituted hydrocarbon solvent, and the like.

The processing solution for the semiconductor device according to the present embodiment having the above-described composition can be suitably used as an aqueous processing solution containing water (b). The processing solution for the semiconductor device according to the present embodiment can be suitably used as a processing solution for a below-described substrate. In addition, it can also be suitably used in a later-described method for processing a substrate. Hereinafter, a preferred example of usage of the processing solution for the semiconductor device will be described.

Substrate to which a Processing Solution is Used, and Method for Processing a Substrate

Substrate

The processing solution for the semiconductor device according to the present embodiment is suitable for removing a residue generated after a resist pattern is formed on a substrate having a metal layer and etching processing is performed thereon, the substrate being used for manufacturing a semiconductor device. More specifically, an etching processing may be performed on the substrate with the resist pattern (for example, a photoresist) formed on the substrate as a mask. Subsequently, an ashing processing may be further performed. Thereafter, a processing with the processing solution for the semiconductor device according to the present embodiment can be performed on the substrate. Alternatively, the processing solution for the semiconductor device according to the present embodiment may be used as a processing solution (cleaning solution) after a chemical mechanical polishing (CMP) process. The processing of the substrate may be performed in a single wafer method. The processing may for example be performed by immersing the substrate in the cleaning solution, applying the processing solution to the substrate, or the like.

Regarding the structure of the substrate, the processing solution for the semiconductor device according to the present embodiment is suitable when the semiconductor device includes a substrate having a metal layer containing Al and the processing solution is used for processing the metal layer. Examples of the metal layer containing Al may include a metal layer containing Al, an Al alloy, an AlCu alloy, and the like.

Alternatively, the processing solution for the semiconductor device according to the present embodiment is suitable when the semiconductor device includes a substrate having a metal layer containing Cu and the processing solution is used for processing the metal layer. Examples of the metal layer containing Cu may include a metal layer containing Cu, a Cu alloy, an AlCu alloy, and the like.

The processing solution for the semiconductor device according to the present embodiment can be suitably used for cleaning a substrate. A preferred example of a method for processing a substrate according to the present embodiment may for example be a method for processing a substrate, including:

forming a resist pattern on the substrate having an Al and/or Cu-containing metal layer;

dry etching the substrate with the resist pattern as a mask; and removing a residue from the substrate using a processing solution for a semiconductor device that contains a fluorine-containing compound, a water-soluble organic solvent, water, and a cyclic ether compound. As the above processing solution for the semiconductor device, for example, a processing solution that has the above-described composition can be used. As the Al and/or Cu-containing metal layer, a metal layer containing at least one selected from the group consisting of Cu, a Cu alloy, Al, an Al alloy, an AlCu alloy, etc. as described above is exemplified, but a specific example of the substrate having a metal layer will be described later.

Method for Manufacturing a Semiconductor Device

A preferred example of a method for manufacturing a semiconductor device according to the present embodiment may for example be a method for manufacturing a semiconductor device, including:

(1) forming a resist pattern on a substrate having an Al and/or Cu-containing metal layer;

(2) dry etching the substrate with the resist pattern as a mask; and (3) removing a residue from the substrate using a processing solution for a semiconductor device that contains a fluorine-containing compound, a water-soluble organic solvent, water, and a cyclic ether compound.

As necessary, an ashing step may be employed after the step (ii) (dry etching step). That is, the step (ii) may be a step in which a step (ii-1) of dry etching the substrate using the resist pattern as a mask and a step (ii-2) of ashing the resist pattern are performed. In the manufacturing (or processing) method according to the present embodiment, the substrate is processed with the above-described processing solution for the semiconductor device after etching and ashing processings are performed on the substrate using a resist pattern (photoresist pattern, etc.) formed on the substrate as a mask.

The step (i) will be described. For example, a photoresist layer is formed on a substrate such as a silicon wafer, a glass substrate, etc. If desired, a conductive metal or metal oxide film, an insulating film such as a $SiO_2$ film, etc. may be formed on the substrate by vapor deposition or the like. Examples of a metal contained in the conductive metal or metal oxide film, etc. may include aluminum (Al); an aluminum alloy such as aluminum-silicon (Al—Si), etc.; copper (Cu); a copper alloy (Cu alloy) such as copper-silicon (Cu—Si), etc.; an aluminum-copper alloy (AlCu alloy) such as aluminum-copper (Al—Cu), aluminum-silicon-copper (Al—Si—Cu), etc.; titanium (Ti); a titanium alloy (Ti alloy) such as titanium nitride (TiN), titanium tungsten (TiW), etc.; tantalum (Ta); tantalum nitride (TaN); tungsten (W); tungsten nitride (WN); and the like. These are formed on the substrate in a single layer or multiple layers. In particular, when the above processing is performed on a substrate having a metal layer containing at least one selected from the group consisting of Al, an Al alloy, Cu, a Cu alloy, an AlCu alloy, Ti, a Ti alloy, etc., a residue is likely to adhere and a deposition is likely to be generated. In this regard, the processing solution for the semiconductor device according to the present embodiment can exhibit particularly excellent residue removal properties. Furthermore, it can exhibit more excellent effect in the case of a substrate that includes a first metal layer containing at least one selected from the group consisting of Al, an Al alloy, Cu, a Cu alloy, an AlCu alloy, etc. and a second metal layer containing at least one selected from the group consisting of Ti, a Ti alloy, etc.

The step (ii) will be described. As a resist, for example, a photoresist pattern is formed on the substrate. Exposure and development conditions in that case may be appropriately selected depending on a purpose and a photoresist used. Exposure can be performed on the photoresist layer through a desired mask pattern by, for example, a light source that emits active light such as a ultraviolet ray, deep ultraviolet ray, excimer laser, X-ray, electron beam, etc. (for example, a low-pressure mercury lamp, high-pressure mercury lamp, ultra-high-pressure mercury lamp, xenon lamp, etc.). Alternatively, the photoresist layer may be irradiated by a scanning electron beam. Thereafter, a post-exposure heat processing (post-exposure bake) may be performed, as necessary.

Then, pattern development is performed using a photoresist developer to obtain a predetermined photoresist pattern. A developing method is not particularly limited, and any known method can be employed. An appropriate developing method may be selected depending on a purpose, and may for example be immersion development, in which a substrate coated with a photoresist is immersed in a developer solution for a certain period of time, and then washed with water and dried; puddle development, in which a developer is placed on a surface of an applied photoresist, allowed to stand for a certain period of time, and then washed with water and dried; spray development, in which a developer is sprayed on a surface of a photoresist, and then washed with water and dried; and or the like.

Next, using the formed photoresist pattern as a mask, the above-mentioned conductive metal or metal oxide film or insulating film is selectively etched to form a fine circuit by dry etching or the like. Thereafter, an unnecessary region of the photoresist layer is removed by plasma ashing, as necessary.

The step (iii) will be described. When etching, or etching and ashing are performed in the step (ii), a resist residue or a metal deposition generated during the etching of a metal film as a residue adheres to and remains on a surface of the substrate. These residues are immersed in or brought into contact with the processing solution for the semiconductor device according to the present embodiment, so that the residues that adhere to and remain on the substrate are removed. By using the processing solution for the semiconductor device according to the present embodiment, these residues can be easily removed. In particular, the processing solution for the semiconductor device according to the present embodiment has excellent anti-corrosion effect on a substrate having a metal layer containing a metal such as Al, an Al alloy, Cu, a Cu alloy, an AlCu alloy, or the like. Furthermore, it can exhibit more excellent effect in anti-corrosion effect and residue removal properties for a substrate that includes a first metal layer containing at least one selected from the group consisting of Al, an Al alloy, Cu, a Cu alloy, an AlCu alloy, etc. and a second metal layer containing at least one selected from the group consisting of Ti, a Ti alloy, etc.

Conditions for the processing using the processing solution for the semiconductor device according to the present embodiment may be suitably selected in consideration of the structure, material, and characteristics of a desired semiconductor device, etching and ashing conditions, etc. For example, when the processing is performed by immersion in the processing solution, the immersion time is preferably from 1 to 60 minutes, and more preferably from 1 to 15 minutes. The temperature during the immersion is preferably from 5 to 30 °C, and more preferably from 20 to 25 °C.

After the processing using the processing solution for the semiconductor device according to the present embodiment, the substrate can be rinsed, as necessary. For example, the substrate (or semiconductor device) may be rinsed using at least one selected from the group consisting of methanol, isopropanol, ethylene glycol, water, a mixture of water and a surfactant, and a mixture thereof. After the rinsing, it can be dried by nitrogen gas, spin drying cycle, steam drying, or the like.

As described above, the processing solution for the semiconductor device according to the present embodiment has excellent residue removal properties for a residue generated after etching and excellent anti-corrosion effect on a substrate on which a metal layer is formed. Furthermore, also when used after etching and/or ashing, the processing solution for the semiconductor device according to the present embodiment can exhibit excellent effect. The processing solution for the semiconductor device according to the present embodiment can efficiently remove not only a residue generated from a resist (a resist residue) but also a residue generated from a substrate and/or metal layer (a metal oxide residue), and the like.

Since the processing solution for the semiconductor device according to the present embodiment is aqueous, it can reduce an environmental load and can be expected to be efficiently distilled from a processed substrate (semiconductor device) in a subsequent rinsing step. Furthermore, the processing solution for the semiconductor device according to the present embodiment can also be used in a form that does not contain a metal ion (as a metal-free processing solution).

EXAMPLES

The present invention will be described in more detail with reference to the following Examples and Comparative examples, but the present invention is not limited in any way to the following examples. Unless otherwise specified below, quantities are based on mass, and experiments were conducted under conditions of 25 °C and atmospheric pressure.

Components Used

Fluorine-containing compounds, water, cyclic ether compounds, and water-soluble organic solvents used in the examples are as follows. Each component was prepared to the concentration shown in Table 1 to obtain each processing solution. Note that (d) water-soluble organic solvent was prepared as the remaining part of each processing solution. The mass % values of (d) in Table 1 are given as the basis for calculating the mass ratio of (d)/(c).

(a) Fluorine-containing compound

Ammonium fluoride (AF)

Hydrogen fluoride (HF)

(b) Water

Ultrapure water (DIW)

(c) Cyclic ether compound

Ethylene oxide (EO: 3-membered ring, 1 oxygen atom)

1,4-dioxane (DO: 6-membered ring, 2 oxygen atoms)

(d) Water-soluble organic solvent

Dimethyl sulfoxide (DMSO)

N,N-dimethylformamide (DMF)

N-methyl-2-pyrrolidone (NMP)

Example 1

By performing dry etching using chlorine-based gas with a resist pattern as a mask in a commercially available etching device, and then removing the resist pattern by dechlorination and ashing processings using a mixed gas of oxygen and fluorine, a silicon wafer substrate having a TiN/Ti/AlCu/TiN/Ti/$SiO_2$ stack was prepared and used to conduct a test. Note that AlCu is an aluminum-copper alloy. The side surfaces of the AlCu in the stack were exposed, and resist residues and TiO-based residues (Hereinafter, these may be collectively referred to as "residues.") were adhered to the side surfaces and the surface of the wafer substrate where the stack was not present.

Thereafter, the wafer substrate was cut into small sample pieces of about 1 cm× about 2 cm, and the small sample pieces were immersed and cleaned in the processing solution of Example 1 (see Table 1) for 5 minutes and 10 minutes. (In the evaluation of residue removal properties, the immersion time was 5 minutes, and in the evaluation of anti-corrosion properties for AlCu, the immersion time was 10 minutes.) After the immersion, the small sample pieces were taken out and rinsed with ultrapure water. Subsequently, the interface between the AlCu layer and the Ti-containing layer on a side surface of the stack was observed with a scanning electron microscope (SEM: 20,000× magnification), and the residue removal properties, and the anti-corrosion properties for AlCu were evaluated based on the following criteria.

Examples 2 to 11, Comparative Examples 1 to 4

Processing solutions were prepared in the same manner as in Example 1, except that the conditions were changed to those listed in Table 1. Small sample pieces were prepared in the same manner as in Example 1, and the residue removal properties, and the anti-corrosion properties for AlCu were evaluated based on the following criteria.

Evaluation Conditions

Evaluation of Residue Removal Properties

A:= When the small sample piece was observed with the SEM after it was immersed in the processing solution for 5 minutes, no residue was confirmed within the 18 $\mu m^2$ imaging area, and the interface between the layers was confirmed.

B: When the small sample piece was observed with the SEM after it was immersed in the processing solution for 5 minutes, residues were confirmed within the 18 $\mu m^2$ imaging area, but the interface between the layers was confirmed.

C: When the small sample piece was observed with the SEM after it was immersed in the processing solution for 5 minutes, residues were confirmed within the imaging area, and the interface between the layers could not be confirmed.

Evaluation of anti-corrosion properties for AlCu

A: When the surface of the AlCu was observed in an SEM photograph after the small sample piece was immersed in the processing solution for 10 minutes, no corrosion was confirmed.

B: No corrosion was observed after the small sample piece was immersed in the processing solution for 5 minutes, and slight corrosion was confirmed when the surface of the AlCu was observed in an SEM photograph after it was immersed for 10 minutes.

C: No corrosion was observed after the small sample piece was immersed in the processing solution for 5 minutes, and corrosion was confirmed when the surface of the AlCu was observed in an SEM photograph after it was immersed for 10 minutes.

D: Corrosion was confirmed after the small sample piece was immersed in the processing solution for 5 minutes.

Table 1 shows the composition of each processing solution of Examples and Comparative examples, and Table 2 shows the evaluation results of Examples and Comparative examples.

TABLE 1

| | (a) Fluorine-containing compound | | (b) Water | (c) Cyclic ether compound | (d) Water-soluble organic solvent | Mass ratio of (d)/(c) |
|---|---|---|---|---|---|---|
| Example 1 | AF 1 mass % | — | DIW 30 mass % | EO 0.000005 mass % | DMSO 68.999995 mass % | 13,799,999 |
| Example 2 | AF 1 mass % | — | DIW 30 mass % | DO 0.000005 mass % | DMSO 68.999995 mass % | 13,799,999 |
| Example 3 | AF 1 mass % | — | DIW 30 mass % | EO 0.00001 mass % | DMSO 68.99999 mass % | 6,899,999 |
| Example 4 | AF 1 mass % | — | DIW 30 mass % | EO 0.00005 mass % | DMSO 68.99995 mass % | 1,379,999 |
| Example 5 | AF 1 mass % | — | DIW 30 mass % | Mixture of EO and DO (mass ratio of 1:1) 0.00005 mass % | DMSO 68.99995 mass % | 1,379,999 |
| Example 6 | AF 1 mass % | — | DIW 30 mass % | EO 0.0001 mass % | DMSO 68.9999 mass % | 689,999 |
| Example 7 | AF 1 mass % | — | DIW 30 mass % | EO 0.0003 mass % | DMSO 68.9997 mass % | 229,999 |
| Example 8 | AF 1 mass % | — | DIW 30 mass % | EO 0.0005 mass % | DMSO 68.9995 mass % | 137,999 |
| Example 9 | AF 1 mass % | — | DIW 30 mass % | EO 0.00001 mass % | DMF 68.99999 mass % | 6,899,999 |
| Example 10 | AF 1 mass % | — | DIW 30 mass % | EO 0.00001 mass % | NMP 68.99999 mass % | 6,899,999 |
| Example 11 | AF 1 mass % | HF 0.05 mass % | DIW 30 mass % | EO 0.00001 mass % | DMSO 68.94999 mass % | 6,894,999 |
| Comparative example 1 | AF 1 mass % | HF 0.05 mass % | DIW 30 mass % | — | DMSO 68.95 mass % | — |
| Comparative example 2 | AF 1 mass % | — | DIW 30 mass % | — | DMSO 69 mass % | — |
| Comparative example 3 | AF 1 mass % | — | DIW 30 mass % | — | DMF 69 mass % | — |
| Comparative example 4 | AF 1 mass % | — | DIW 30 mass % | — | NMP 69 mass % | — |

TABLE 2

| | Residue removal properties | Anti-corrosion properties for AlCu |
|---|---|---|
| Example 1 | B | A |
| Example 2 | B | A |
| Example 3 | A | A |
| Example 4 | A | A |
| Example 5 | A | A |
| Example 6 | A | A |
| Example 7 | A | A |
| Example 8 | B | A |
| Example 9 | A | A |

TABLE 2-continued

| | Residue removal properties | Anti-corrosion properties for AlCu |
|---|---|---|
| Example 10 | A | A |
| Example 11 | A | A |
| Comparative example 1 | B | D |
| Comparative example 2 | C | D |
| Comparative example 3 | C | D |
| Comparative example 4 | C | D |

From the above, it was at least confirmed that the processing solutions according to the Examples have excellent residue removal properties for a residue generated after etching as well as excellent anti-corrosion effect on a substrate on which a metal layer is formed.

What is claimed is:

1. A processing solution for a semiconductor device, comprising:

a fluorine-containing compound, water, a cyclic ether compound, and a water-soluble organic solvent other than the cyclic ether compound, wherein the cyclic ether compound comprises at least one selected from the group consisting of oxirane and 1,4-dioxane;

wherein the water-soluble organic solvent comprises at least one selected from the group consisting of dimethyl sulfoxide, N,N-dimethylformamide, and N-methyl-2-pyrrolidone; and wherein a content of the water-soluble organic solvent in the processing solution is from 65% by mass to 80% by mass.

2. The processing solution for the semiconductor device according to claim 1, wherein a mass ratio of the water-soluble organic solvent to the cyclic ether compound is from 100,000 to 15,000,000.

3. The processing solution for the semiconductor device according to claim 1, wherein a content of the cyclic ether compound in the processing solution is from 0.000001% by mass to 10% by mass.

4. The processing solution for the semiconductor device according to claim 1, wherein:

the semiconductor device comprises a substrate comprising an Al-containing metal layer; and the processing solution is used for processing the metal layer.

5. The processing solution for the semiconductor device according to claim 1, wherein:

the semiconductor device comprises a substrate comprising a Cu-containing metal layer; and the processing solution is used for processing the metal layer.

6. The processing solution for the semiconductor device according to claim 1, wherein:

the processing solution is used for removing a residue generated on a substrate comprising a metal layer after an etching processing; and the substrate is used for manufacturing the semiconductor device.

7. A method for processing a substrate, comprising:

forming a resist pattern on the substrate comprising an Al and/or Cu-containing metal layer;

dry etching the substrate with the resist pattern as a mask; and removing a residue from the substrate using a processing solution for a semiconductor device that comprises a fluorine-containing compound, a water-soluble organic solvent, water, and a cyclic ether compound, wherein the cyclic ether compound comprises at least one selected from the group consisting of oxirane and 1,4-dioxane;

wherein the water-soluble organic solvent comprises at least one selected from the group consisting of dimethyl sulfoxide, N,N-dimethylformamide, and N-methyl-2-pyrrolidone; and wherein a content of the water-soluble organic solvent in the processing solution is from 65% by mass to 80% by mass.

8. A method for manufacturing a semiconductor device, comprising:

forming a resist pattern on the substrate comprising an Al and/or Cu-containing metal layer;

dry etching the substrate with the resist pattern as a mask; and removing a residue from the substrate using a processing solution for a semiconductor device that comprises a fluorine-containing compound, a water-soluble organic solvent, water, and a cyclic ether compound, wherein the cyclic ether compound comprises at least one selected from the group consisting of oxirane and 1,4-dioxane;

wherein the water-soluble organic solvent comprises at least one selected from the group consisting of dimethyl sulfoxide, N,N-dimethylformamide, and N-methyl-2-pyrrolidone; and wherein a content of the water-soluble organic solvent in the processing solution is from 65% by mass to 80% by mass.

9. The processing solution according to claim 1, wherein a content of the cyclic ether compound in the processing solution is from 0.000001% by mass to 0.01% by mass.

10. The processing solution according to claim 1, wherein a content of the cyclic ether compound in the processing solution is from 0.000008% by mass to 0.0003% by mass.

* * * * *